(12) United States Patent
Matsuta et al.

(10) Patent No.: US 6,597,563 B2
(45) Date of Patent: Jul. 22, 2003

(54) THIN IRREVERSIBLE CIRCUIT ELEMENT PROVIDED WITH CAPACITORS

(75) Inventors: Shigetoshi Matsuta, Fukushima-ken (JP); Eiichi Komai, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/313,263

(22) Filed: Dec. 6, 2002

(65) Prior Publication Data

US 2003/0112579 A1 Jun. 19, 2003

(30) Foreign Application Priority Data

Dec. 17, 2001 (JP) ........................................ 2001-383276

(51) Int. Cl.[7] ............................................... H01G 4/06
(52) U.S. Cl. ........................ 361/311; 361/312; 333/1.1
(58) Field of Search ................................. 361/311, 312, 361/306.3; 333/1.1; 257/200

(56) References Cited

U.S. PATENT DOCUMENTS 5,900,789 A * 5/1999 Yamamoto et al. .......... 333/1.1

FOREIGN PATENT DOCUMENTS

JP 2002-033606 1/2002

* cited by examiner

*Primary Examiner*—Anthony Dinkins
(74) *Attorney, Agent, or Firm*—Brinks Hofer Gilson & Lione

(57) ABSTRACT

An irreversible circuit element includes a planar ferrite member, a plurality of dielectrics which are formed on the ferrite member in a laminated manner and are made of an insulation material, and the first, the second and the third center conductors which are formed on surfaces different in a vertical direction while sandwiching the dielectrics therebetween and have portions thereof to cross each other in the vertical direction. Accordingly, it is possible to reduce the thickness in the vertical direction so that a thin irreversible circuit element can be provided.

13 Claims, 8 Drawing Sheets

THIN IRREVERSIBLE CIRCUIT ELEMENT PROVIDED WITH CAPACITORS

BACKGROUND OF THE INVENTION

1. Field of the Invention

The present invention relates to an irreversible circuit element such as a circulator, an isolator or the like which is used in an antenna multicoupler or the like.

2. Description of the Related Art

To explain the constitution of a conventional irreversible circuit element in conjunction with FIG. 8 and FIG. 9, an irreversible circuit element S2 is made up of a dielectric substrate 52 which includes three center conductors 51 formed of three metal plates which are arranged at an interval of 120 degrees and have portions thereof to cross each other and an insulation material which embeds these three center conductors 51 by molding, a magnet 53 which is arranged over the crossing portion of the center conductors 51, a circular ferrite plate 58 which is arranged below a crossing portion of the center conductors 51, a first yoke 54 which is formed of a magnetic plate and is arranged such that the first yoke 54 covers an outer portion of the magnet 53 disposed above the dielectric substrate 52, and a bottomed second yoke 55 which is connected to the first yoke 54, is made of a magnetic plate and is arranged such that the second yoke 55 covers an outside of the ferrite plate 58.

Further, in the irreversible circuit element S2, a magnetic closed circuit is formed of the first and second yokes 54, 55 and, at the same time, terminals 51a for inputting/outputting which are provided to three center conductors 51 are projected outside from sides of the first and second yokes 54, 55.

A printed circuit board 56 for an antenna multicoupler or the like is provided with a hole 56a and a plurality of conductive patterns 57 are formed on a periphery of the hole 56a.

Further, on the printed circuit board 56 to which the conductive patterns 57 are applied, various electric components such as chip-type capacitors (not shown in the drawings) connected to the irreversible circuit element S2 are mounted thus forming a desired electronic circuit.

Further, the irreversible circuit element S2 is positioned in the hole 56a of the printed circuit board 56 and the terminals 51a of the center conductors 51 and ground electrodes not shown in the drawing are placed on the conductive patterns 57 and are connected to the conductive patterns 57 by soldering.

The conventional irreversible circuit element is configured such that the dielectric substrate 52 which embeds three center conductors 51 made of metal plates by molding and the ferrite plate 58 are overlapped to each other and hence, the irreversible circuit element exhibits the large thickness and there has been a drawback that the constitution is not suitable for reducing the thickness.

Further, since the capacitor connected to the irreversible circuit element S2 is mounted on the printed circuit board 56, there exists a drawback that not only a chip-type capacitor is necessary but also the printed circuit board 56 becomes large-sized.

SUMMARY OF THE INVENTION

Accordingly, it is an object of the present invention to provide a thin irreversible circuit element provided with capacitors.

As the first means to solve the above-mentioned drawbacks, an irreversible circuit element including a planar ferrite member, a plurality of dielectrics which are laminated to the ferrite member, the dielectrics being formed of an insulation material, and first, second and third center conductors which are formed on surfaces different in the vertical direction while sandwiching the dielectrics therebetween, the first, the second and the third center conductors having portions thereof to cross each other in the vertical direction.

As the second means to solve the above-mentioned drawbacks, the irreversible circuit element is configured such that the first, the second and the third center conductors are formed on different surfaces of the dielectrics using conductive layers and, at the same time, the dielectrics have connection portions which are made of conductive layers which are respectively connected to the first, the second and the third center conductors.

As the third means to solve the above-mentioned drawbacks, the irreversible circuit element is configured such that a plurality of electrodes which face portions of the connection portions which are respectively connected to the first, the second and the third center conductors are provided to the dielectrics and/or the ferrite member, and a capacitor is formed between one portion of the connection portion and the electrode.

As the fourth means to solve the above-mentioned drawbacks, the irreversible circuit element is configured such that the plurality of electrodes formed of the conductive layers are formed on an upper surface of the ferrite member.

As the fifth means to solve the above-mentioned drawbacks, the irreversible circuit element is configured such that a plurality of holes are formed in the dielectrics and the ferrite member, and one-end sides of the first, the second and the third center conductors are electrically led out to a lower surface of the ferrite member in a state that one end sides of the first, the second and the third center conductors are connected to connection conductors formed inside the holes.

As the sixth means to solve the above-mentioned drawbacks, the irreversible circuit element is configured such that the electrodes are connected to the connection conductors.

As the seventh means to solve the above-mentioned drawbacks, the irreversible circuit element is configured such that a lower electrode which is formed of a conductive layer is formed on a lower surface of the ferrite member and the connection conductors are connected to the lower electrode.

As the eighth means to solve the above-mentioned drawbacks, the irreversible circuit element is configured such that the connection portions which are connected to other-end sides of the first, the second and the third center conductors are electrically led out to a lower side of the ferrite member by way of the first conductor made of a conductive layer formed on a side face of the ferrite member.

As the ninth means to solve the above-mentioned drawbacks, the irreversible circuit element is configured such that one-end sides of the electrodes are electrically led out to a lower side of the ferrite member by way of a second conductor which is formed of a conductive layer provided to a side face of the ferrite member.

As the tenth means to solve the above-mentioned drawbacks, the irreversible circuit element is configured such that the dielectrics are formed of insulation films.

As the eleventh means to solve the above-mentioned drawbacks, the irreversible circuit element is configured such that the ferrite member is constituted of a block body which is formed by laminating a plurality of ferrite thin plates.

As the twelfth means to solve the above-mentioned drawbacks, the irreversible circuit element is configured such that the irreversible circuit element includes a magnet which is arranged over the dielectrics, a first yoke which is arranged to cover the magnet, and a second yoke which is arranged below the ferrite member, and wherein a magnetic closed loop is constituted of the first and the second yokes.

As the thirteenth means to solve the above-mentioned drawbacks, the irreversible circuit element is configured such that the second yoke is arranged in a recess formed below the ferrite member, the second yoke is formed below the ferrite member, and the second yoke is electrically bonded to a lower electrode which becomes conductive with one end sides of the first, the second and the third center conductors.

DESCRIPTION OF PREFERRED EMBODIMENT

Figure 1:
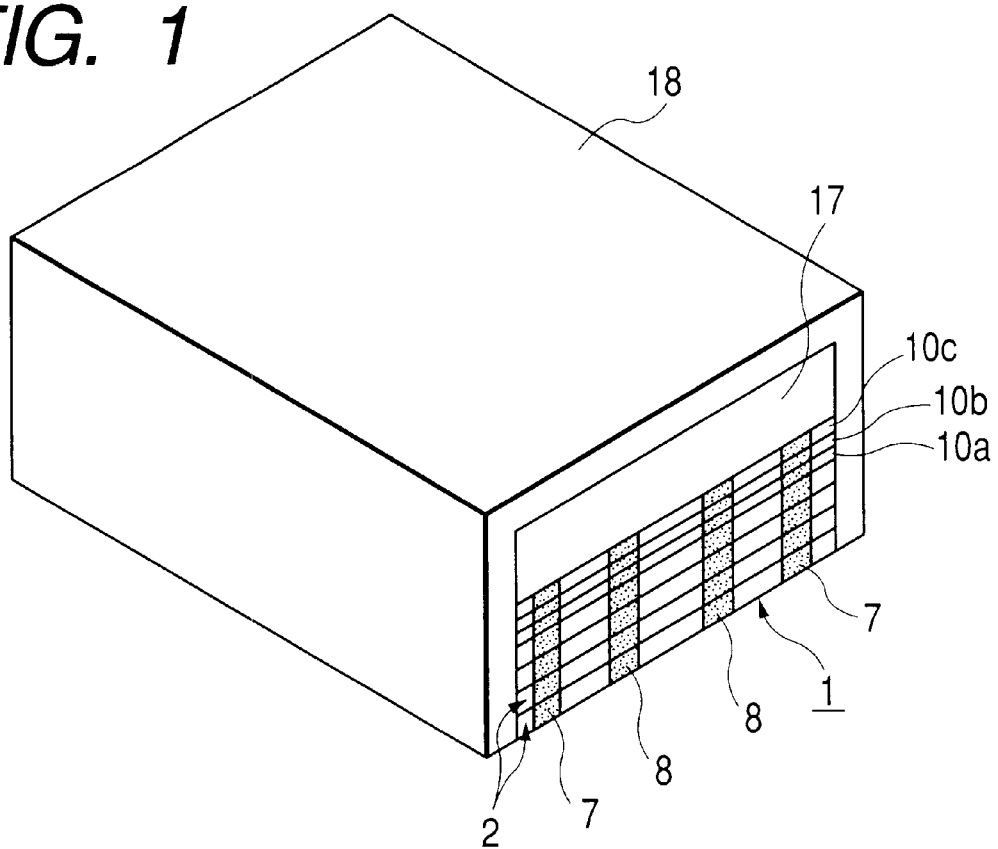
FIG. 1 is a perspective view showing the first embodiment of an irreversible circuit element of the present invention.
Figure 2:
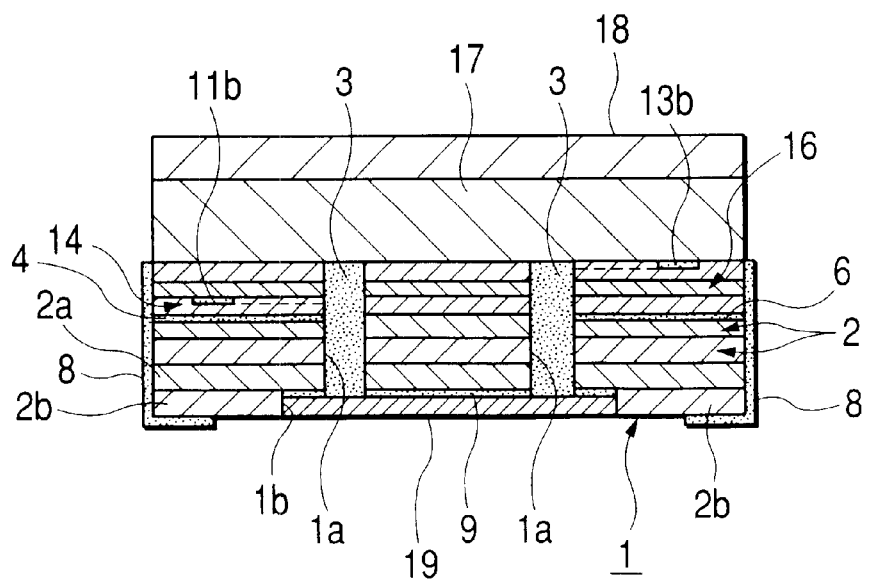
FIG. 2 is a cross-sectional view of an essential part according to the first embodiment of the irreversible circuit element of the present invention.
Figure 3:
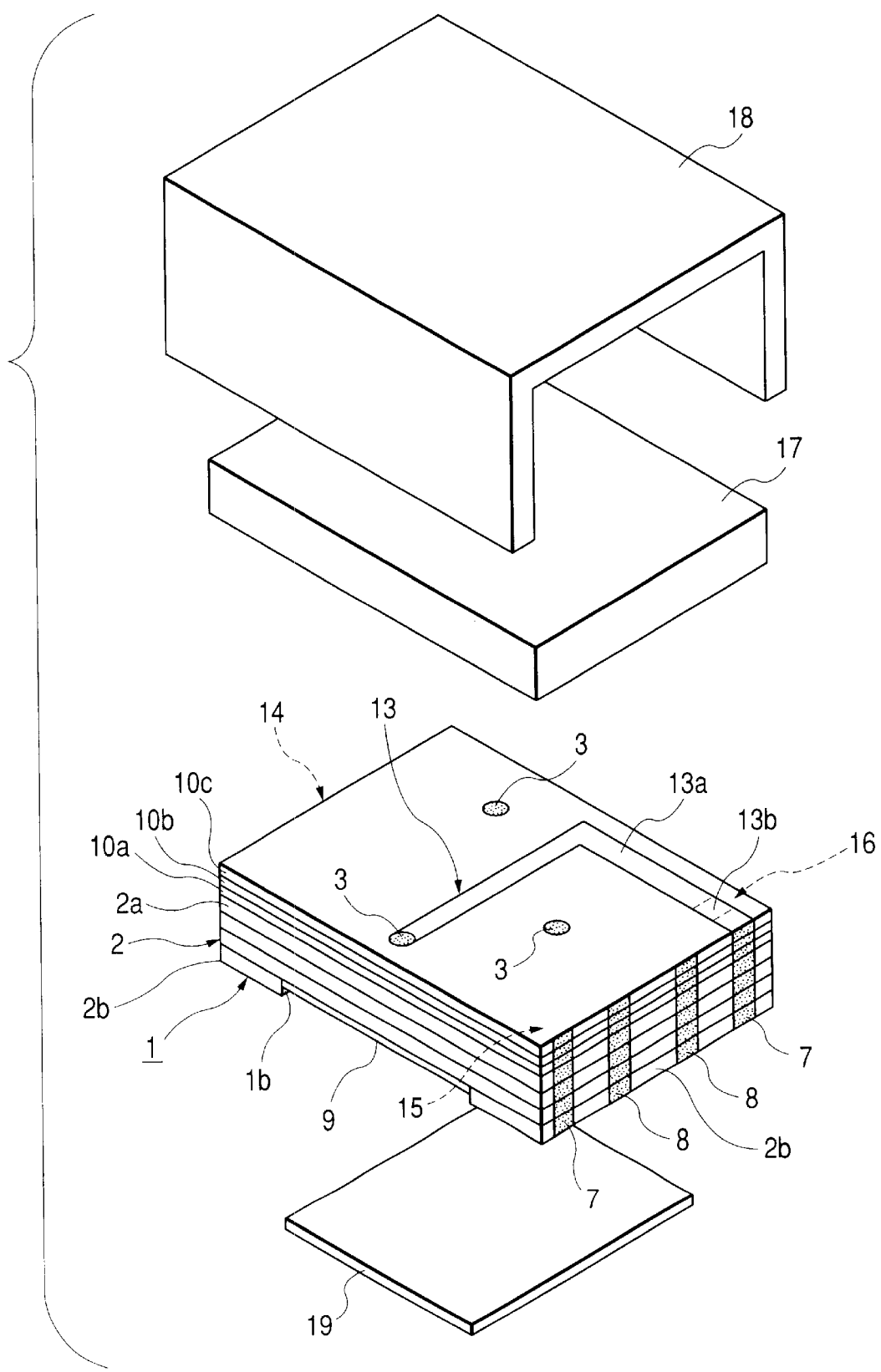
FIG. 3 is an exploded perspective view showing the first embodiment of the irreversible circuit element of the present invention.
Figure 4:
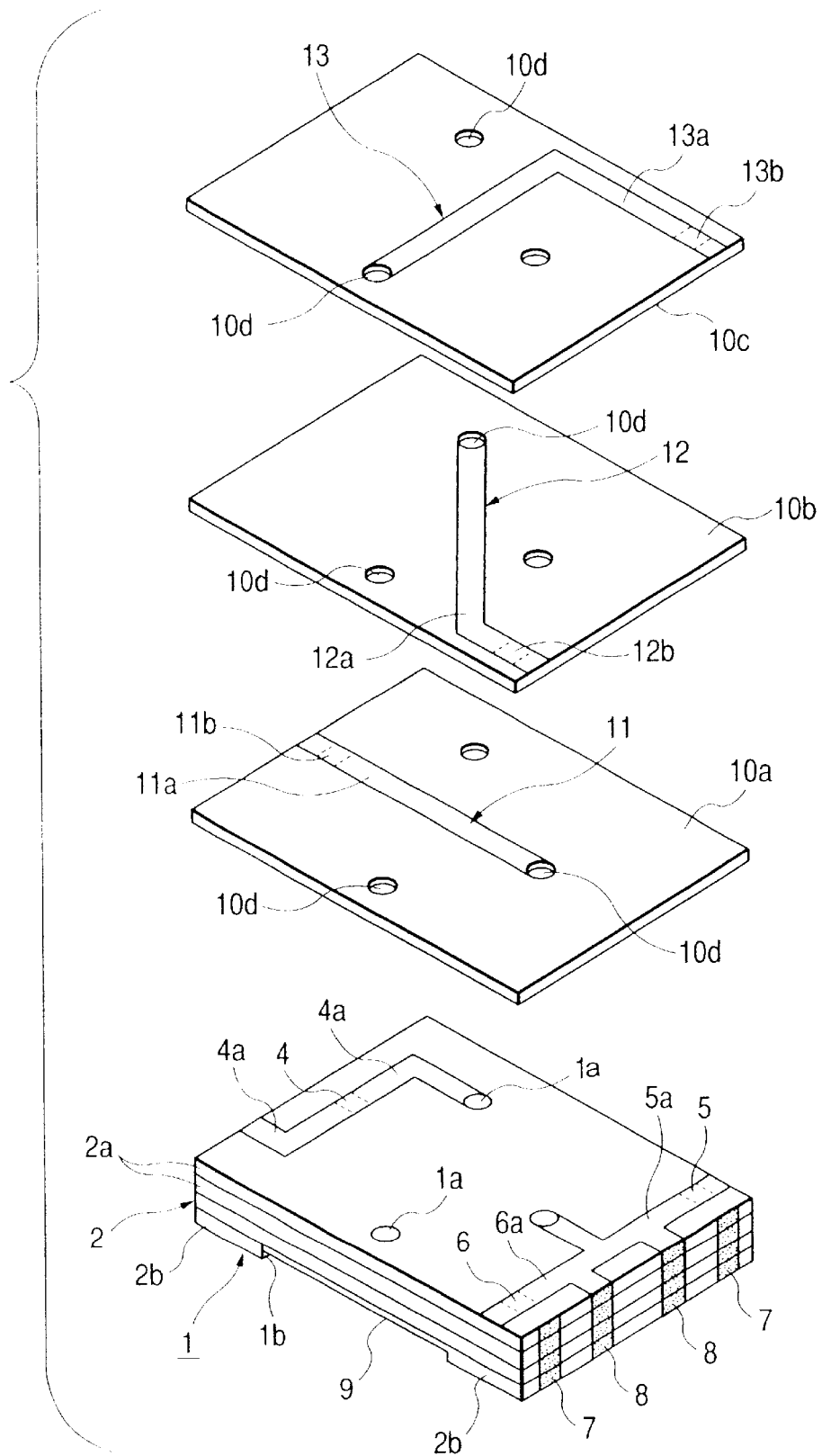
FIG. 4 is an exploded perspective view of a ferrite member and a dielectric in the first embodiment of the irreversible circuit element of the present invention.
Figure 5:
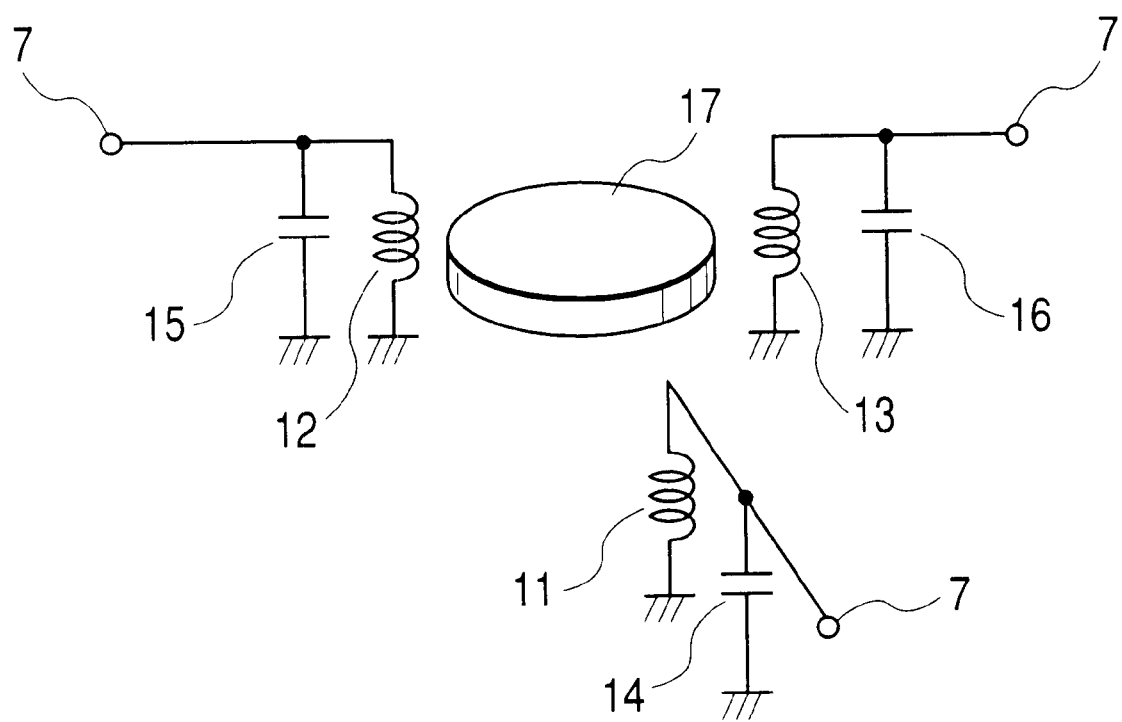
FIG. 5 is an equivalent circuit diagram of a circulator in the first embodiment of the irreversible circuit element of the present invention.
Figure 6:
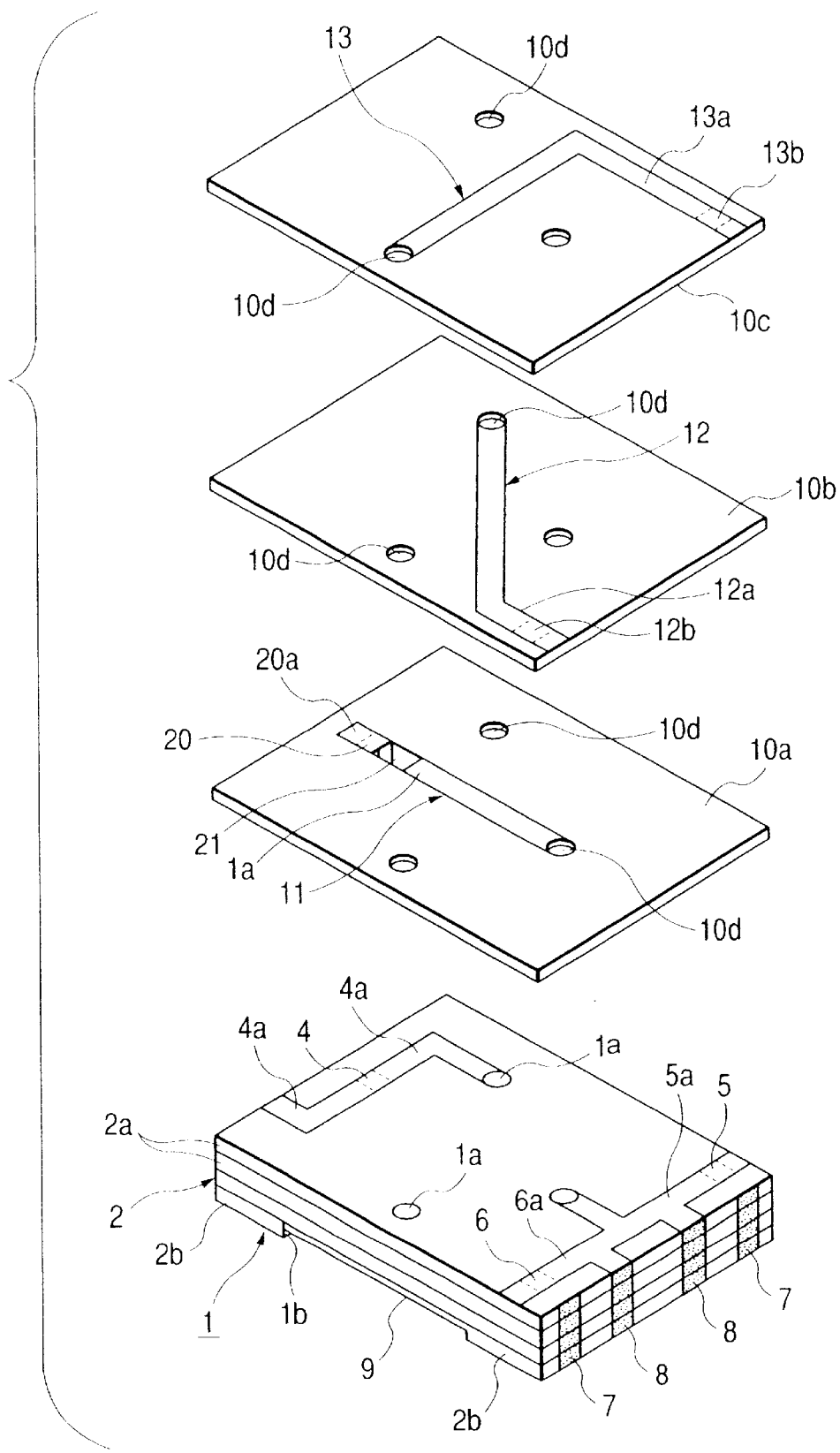
FIG. 6 is an exploded perspective view of a ferrite member and a dielectric in the second embodiment of the irreversible circuit element of the present invention.
Figure 7:
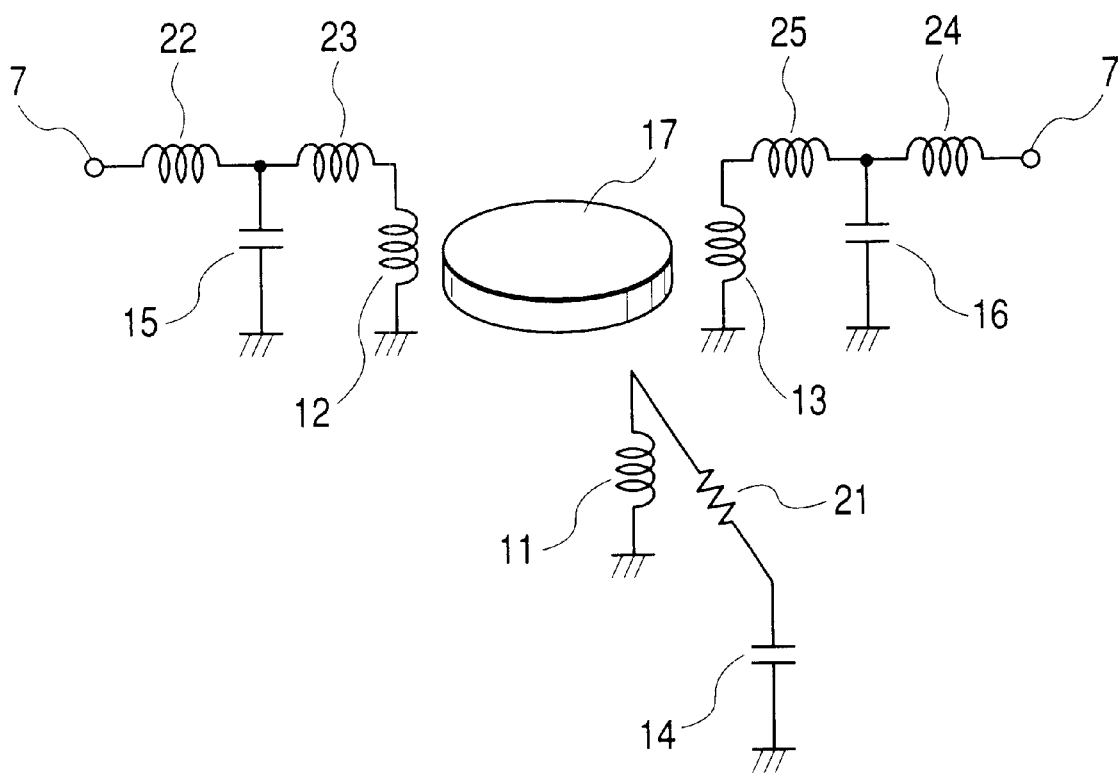
FIG. 7 is an equivalent circuit diagram of an isolator in the second embodiment of the irreversible circuit element of the present invention.
Figure 8:
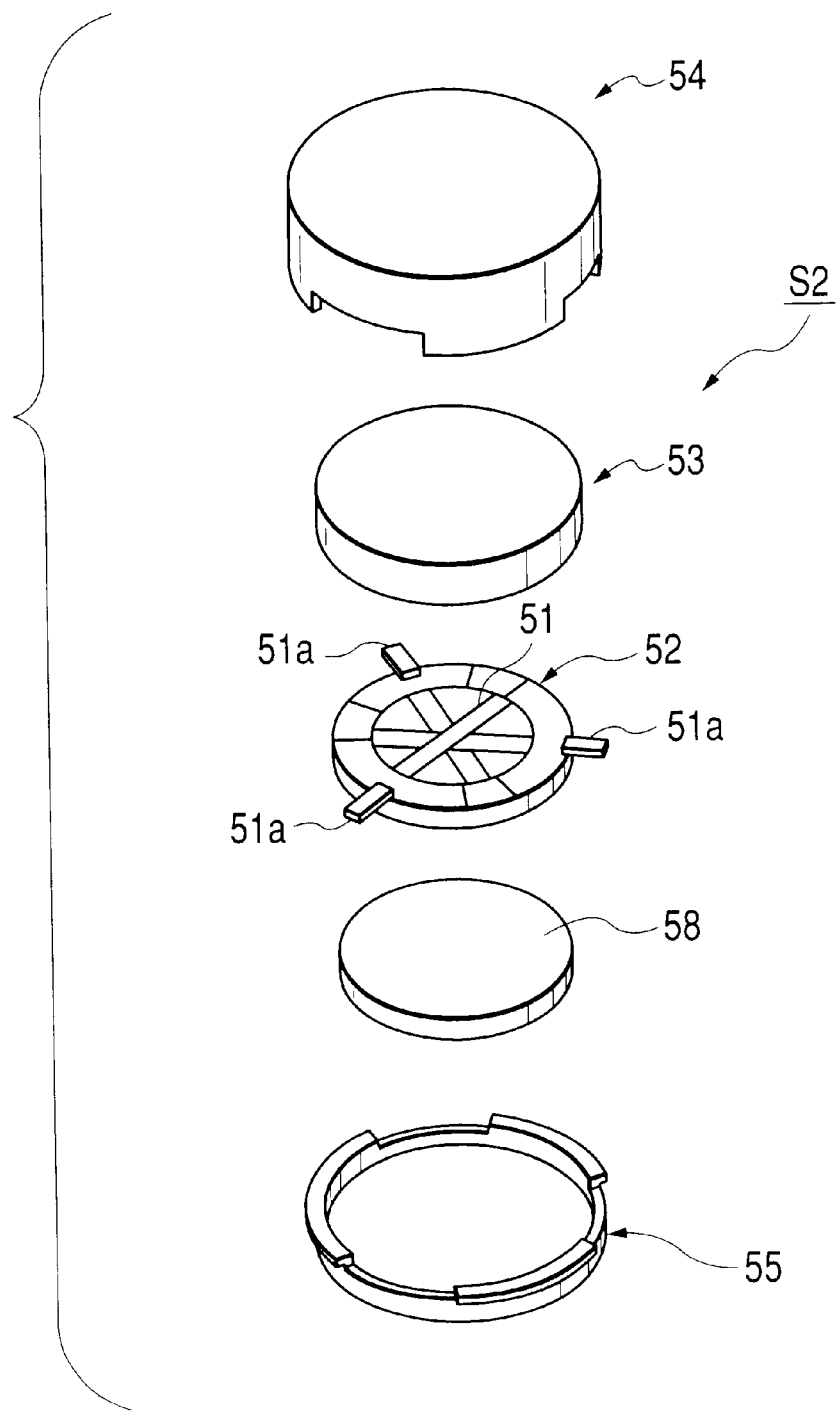
FIG. 8 is an exploded perspective view of a conventional irreversible circuit element.
Figure 9:
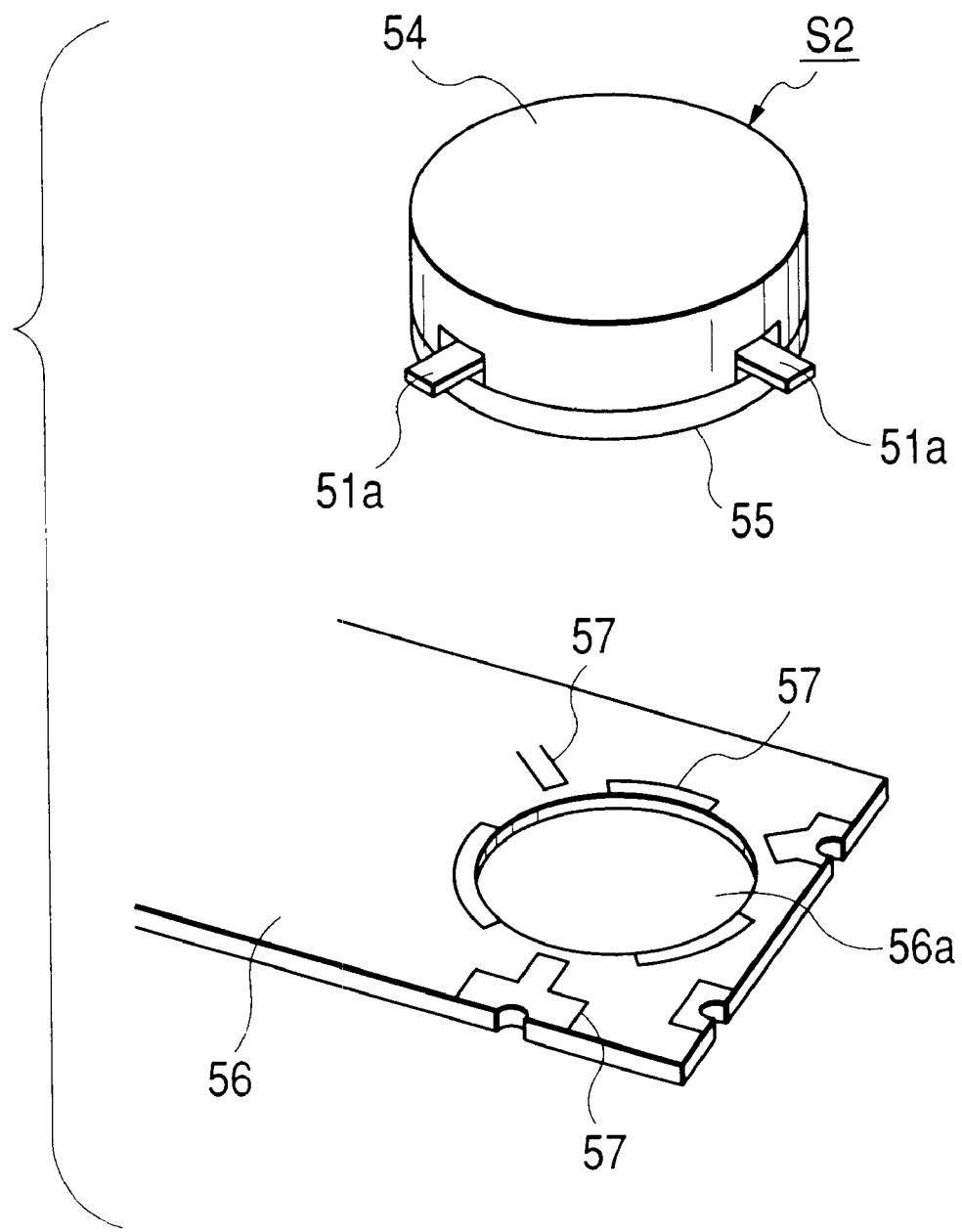
FIG. 9 is an exploded perspective view showing the mounting of the conventional irreversible circuit element.

To explain drawings showing an irreversible circuit element of the present invention, FIG. 1 is a perspective view showing the first embodiment of an irreversible circuit element of the present invention, FIG. 2 is a cross-sectional view of an essential part according to the first embodiment of the irreversible circuit element of the present invention, FIG. 3 is an exploded perspective view showing the first embodiment of the irreversible circuit element of the present invention, FIG. 4 is an exploded perspective view of a ferrite member and a dielectric in the first embodiment of the irreversible circuit element of the present invention, FIG. 5 is an equivalent circuit diagram of a circulator in the first embodiment of the irreversible circuit element of the present invention, FIG. 6 is an exploded perspective view of a ferrite member and a dielectric in the second embodiment of the irreversible circuit element of the present invention, and FIG. 7 is an equivalent circuit diagram of an isolator in the second embodiment of the irreversible circuit element of the present invention.

Subsequently, to explain the constitution of the first embodiment which applies an irreversible circuit element of the present invention to a circulator in conjunction with FIG. 1 to FIG. 5, a ferrite member 1 having a flat plate shape which is made of YIG (Yttrium Iron Garnet) or the like includes three (a plurality of) holes 1a which penetrate the ferrite member 1 vertically and a recess 1b formed in a lower surface of the ferrite member 1.

The ferrite member 1 is constituted of a block body which is formed by sintering a plurality of sheets of laminated rectangular ferrite thin plates 2.

Further, the block body is constituted of, for example, three sheets of wide-width ferrite thin plates 2a and two sheets of narrow-width ferrite thin plates 2b.

Further, two sheets of ferrite plates 2b which are positioned at a lowermost portion are arranged at both sides in the longitudinal direction of the wide-width ferrite thin plate 2a thus exhibiting a state in which a lower surface of a center portion of the wide-width ferrite thin plate 2a is exposed and the recess 1b is formed in the lower surface of the ferrite member 1.

Connection conductors 3 made of copper or the like are respectively filled in the holes 1a formed in the wide-width ferrite thin plates 2a of the ferrite member 1.

Here, the connection conductors 3 may be formed on inner surfaces of the holes 1a.

A plurality of first, second, third electrodes 4, 5, 6 which are formed of conductive layers made of copper or the like are formed on an upper surface of the ferrite member 1 and, at the same time, connection portions 4a, 5a, 6a which are connected to these electrodes 4, 5, 6 and are formed of conductive layers are also formed on the upper surface of the ferrite member 1.

These connection portions 4a, 5a, 6a are formed such that these connection portions 4a, 5a, 6a are connected to at least one connection conductor 3 and, at the same time, extend to sides of the ferrite member 1 which face the connection portions 4a, 5a, 6a.

On the side faces of the ferrite member 1 which face the connection portions 4a, 5a, 6a, a plurality of first and second conductors 7, 8 which are formed of conductive layers made of copper or the like and extend in the vertical direction are formed, wherein these first and second conductors 7, 8 are formed such that they straddle the lower surface of the ferrite member 1.

Then, a plurality of second conductors 8 are respectively connected to the connection portions 4a, 5a, 6a and hence, the first, the second and the third electrodes 4, 5, 6 are electrically led out to lower portions of side faces of the ferrite member 1.

On the recess 1b arranged at the lower surface of the ferrite member 1, a lower electrode 9 made of copper or the like is formed and the lower electrode 9 is connected to the connection conductors 3.

The connection conductors 3, the first, the second and the third electrodes 4, 5, 6, the connection portions 4a, 5a, 6a, the first and second conductors 7, 8 and the lower electrode 9 are formed by baking copper which is filled in the ferrite thin plates 2 or is formed as films on the ferrite thin plates 2 at the time of sintering the ferrite thin plate 2.

On the upper surface of the ferrite member 1, a plurality of laminated dielectrics 10a, 10b, 10c which are formed of insulation films made of thermosetting resin or the like which constitutes an insulation material are formed by lamination.

On one surface of each of these dielectrics 10a, 10b, 10c, there are respectively formed the first, the second and the third center conductors 11, 12, 13 which are formed of conductive layers made of copper or the like and connection portions 11a, 12a, 13a which are connected to end portions of the first, the second and the third center conductors 11, 12, 13 and are formed of conductive layers made of copper or the like.

Then, the first, the second and the third center conductors 11, 12, 13 are arranged at an interval of 120 degrees from each other and assume a state in which these center conductors 11, 12, 13 make respective portions thereof cross each other in the vertical direction.

That is, these first, the second and the third center conductors 11, 12, 13 assume a state in which the first, the second and the third center conductors 11, 12, 13 are formed on surfaces of different dielectric surfaces in the vertical direction while sandwiching the dielectrics.

One portion 11b of the connection portion 11a faces the first electrode 4 while sandwiching the dielectric 11a therebetween, one portion 12b of the connection portion 12a faces the second electrode 5 while sandwiching the dielectrics 10a, 11a and further, one portion 13b of the connection portion 13a faces the third electrode 6 while sandwiching the dielectrics 10a, 10b and 10c therebetween.

As a result, a capacitor 14 is formed by the connection portion 11a and the first electrode 4, a capacitor 15 is formed by the connection portion 12a and the second electrode 5, and a capacitor 16 is formed between the connection portion 13a and the third electrode 6.

Further, holes 10d are formed in the dielectrics 10a, 10b, 10c at one-end side portions of the first, the second and the third center conductors 11, 12, 13 and, at the same time, at positions which are aligned with the hole 1a. The connection conductors 3 made of copper or the like are filled in these holes 10d so that one-end side of the first, the second and the third center conductors 11, 12, 13 are connected to the connection portions 4a, 5a, 6a and the lower electrode 9.

Further, the connection portions 11a, 12a, 13a which are connected to the other end sides of the first, the second and the third center conductors 11, 12, 13 extend to the sides of the dielectrics 10a, 10b, 10c and are connected to the first conductors 7 which are formed on a side face of the ferrite member 1 and are electrically led out to the lower portion of the ferrite member 1.

Then, with respect to the manufacturing of the dielectrics 10a, 10b, 10c, first of all, the dielectric 10a formed of an insulation film is formed on the upper surface of the ferrite member 1 by coating in a state that the holes 10d are formed in the dielectric 10a. Subsequently, the first center conductor 11 and the connection portion 11a are formed on the dielectric 10a by plating, by coating or the like.

Subsequently, the dielectric 10b formed of an insulation film is formed on an upper surface of the dielectric 10a by coating in a state that the holes 10d are formed in the dielectric 10b. Then, the second center conductor 12 and the connection portion 12a are formed on the dielectric 10b by plating, by coating or the like.

Further, the dielectric 10c made of an insulation film is formed on an upper surface of the dielectric 10b by coating in a state that the holes 10d are formed in the dielectric 10c. Then, the third center conductor 13 and the connection portion 13a are formed on the dielectric 10c by plating, by coating or the like. Thereafter, the connection conductors 3 are filled in the hole 10d so that one end sides of the first, the second and the third center conductors 11, 12, 13 are connected to the connection conductors 3 formed in the ferrite member 1.

Here, as another manufacturing method of the dielectrics 10a, 10b, 10c, the connection conductors 3 which are formed in the ferrite member 1 are formed in a state that the connection conductors 3 are slightly projected from the upper surface of the ferrite member 1 and, in this state, the dielectrics 10a, 10b, 10c are applied to the upper surface of the ferrite member 1 by coating except for portions where the connection conductors 3 are projected and, at the same time, the first, the second and the third center conductors 11, 12, 13 are formed such that they are brought into contact with the projecting portions of the connection conductors 3.

A magnet 17 is arranged over the dielectric 10c and a first yoke 18 formed of a U-shaped magnetic plate (iron plate or the like) is arranged outside the magnet 17 such that the first yoke 18 covers the magnet 17.

Then, the first yoke 18 is configured to extend along opposing side faces of the ferrite member 1 where the first and the second conductors 7, 8 are not formed.

A second yoke 19 made of a quadrangular magnetic plate (iron plate or the like) is housed inside the recess 1b of the ferrite member 1 in a state that the second yoke 19 is electrically bonded to the lower electrode 9 by welding, by soldering or the like, wherein the second yoke 19 is arranged such that a lower surface of the second yoke 19 is coplanar with the lower surface of the ferrite member 1.

Here, the first and the second yokes 18, 19 assume a state in which they are brought into contact with each other at a lower position of the ferrite member 1. Due to such a constitution, a magnetic closed circuit is constituted of the first and the second yokes 18, 19 thus forming an irreversible circuit element constituted of the circulator.

Further, although not shown in the drawing, the irreversible circuit element having such a constitution is mounted on a printed circuit board having conductive patterns.

Then, when the irreversible circuit element is mounted on the printed circuit board, the first conductors 7 are connected to the conductive pattern for wiring by soldering and the second conductors 8 are connected to the conductive pattern for grounding by soldering.

Further, by arranging the second yoke 19 on the conductive pattern for grounding, for example, the second yoke 19 can be grounded so that the grounding of the connection conductors 3 is reliably performed.

As indicated by the equivalent circuit diagram shown in FIG. 5, the irreversible circuit element formed of the circulator is constituted such that first conductors 7 which constitute input/output terminals are provided at respective one-end sides of the first, the second and the third center conductors 11, 12, 13, respective other-end sides of the first, the second and the third center conductors 11, 12, 13 are grounded, and grounded capacitors 14, 15, 16 which are constituted of the first, the second and the third electrodes 4, 5, 6 which face respective portions of connection portions 11a, 12a, 13a which are connected to the first, the second, the third center conductors 11, 12, 13 are connected between the first, the second, the third center conductors 11, 12, 13 and the first conductor 7.

Further, FIG. 6 and FIG. 7 show the second embodiment which applies the irreversible circuit element of the present invention to an isolator. As shown in FIG. 6, the second embodiment is constituted such that a resistor 21 which is formed of a resistance layer is provided between an end portion of the first center conductor 11 formed on the dielectric 10a and a connection portion 20, a portion 20a of the connection portion 20 which is connected to the first center conductor 11 by way of the resistor 21 faces the first electrode 4 so as to form the capacitor 14, and one end of the connection portion 20 is not connected to the first conductor 7.

Since other constitutions are equal to those of the above-mentioned first embodiment, the same numerals are given to identical parts and their explanation is omitted here.

Further, the irreversible circuit element formed of the isolator having such a constitution is mounted on a printed circuit board (not shown in the drawing) in the same manner as the above-mentioned first embodiment.

With respect to the irreversible circuit element formed of the isolator, as shown in the equivalent circuit diagram of FIG. 7, the first center conductor 11 and the resistance 21 are connected in series and the grounded capacitor 14 is formed between the connection portion 11a connected to the resistor 21 and the first electrode 4.

Further, the grounded capacitor 15 is formed of a connection portion 12a which is connected to the second center conductor 12 which uses the first conductor 7 provided at one end side thereof as an input/output terminal and the second electrode 5, and connection portions 5a, 12a which are arranged at both sides of the capacitor 15 constitute inductors 22, 23.

Further, the grounded capacitor 16 is formed of a connection portion 13a which is connected to the third center conductor 13 which uses the first conductor 7 provided at one end side thereof as an input/output terminal and the third electrode 6, and connection portions 6a, 13a which are arranged at both sides of the capacitor 16 constitute inductors 24, 25.

Although the above-mentioned embodiments have been explained with respect to the irreversible circuit element in which the electrodes which form the capacitors are mounted on an upper surface of the ferrite member, the electrodes may be formed of dielectrics.

Further, since the above-mentioned embodiments have been explained with the example in which the third center conductor positioned at the uppermost portion is exposed, another dielectric layer may be formed on the exposed third center conductor such that the dielectric layer covers the third center conductor.

To briefly recapitulate the constitutions and the advantageous effects of the irreversible circuit element of the present invention, they are as follows.

The irreversible circuit element of the present invention includes a planar ferrite member, a plurality of dielectrics which are laminated to the ferrite member and are formed of an insulation material, and the first, second and third center conductors which are formed on surfaces which are different in the vertical direction while sandwiching these dielectrics therebetween and have portions thereof to cross each other in the vertical direction. Due to such a constitution, it is possible to provide the thin irreversible circuit element by reducing the thickness thereof in the vertical direction.

Further, the first, the second and the third center conductors are formed on different surfaces of the dielectrics using conductive layers and, at the same time, the dielectrics have connection portions which are made of conductive layers which are respectively connected to the first, the second and the third center conductors. Since the center conductors and connection portions are formed of the conductive layers, it is possible to achieve further reduction of the thickness of the irreversible circuit element and, at the same time, the portions of the connecting portions can be suitably used as capacitors.

Further, a plurality of electrodes which face portions of the connection portions which are respectively connected to the first, the second and the third center conductors are provided to the dielectrics and/or the ferrite member, and the capacitor is formed between one portion of the connection portion and the electrode. Due to such a constitution, it is no more necessary to provide chip type capacitors as separate parts and hence, it is possible to provide the miniaturized and thin irreversible circuit element at a low cost.

Further, since the plurality of electrodes formed of the conductive layers are formed on the upper surface of the ferrite member and hence, the formation of the electrodes is facilitated so that it is possible to enhance the productivity.

Further, a plurality of holes are formed in the dielectrics and the ferrite member, and one-end sides of the first, the second and the third center conductors are electrically led out to the lower surface of the ferrite member in a state that one end sides of the first, the second and the third center conductors are connected to connection conductors formed inside the holes. Accordingly, it is possible to provide the simple grounding constitution of the center conductors so that the productivity can be enhanced.

Further, the electrodes are connected to the connection conductors and hence, it is possible to surely and easily perform the grounding of the capacitors and the center conductors with the simple constitution.

Further, the lower electrode which is formed of the conductive layer is formed on the lower surface of the ferrite member and the connection conductors are connected to the lower electrode and hence, when the irreversible circuit element is mounted on the printed circuit board, it is possible to perform the grounding of the center conductors surely and easily.

Further, the connection portions which are connected to other-end sides of the first, the second and the third center conductors are electrically led out to a lower side of the ferrite member by way of the first conductor made of the conductive layer formed on the side face of the ferrite member. Accordingly, the irreversible circuit element can eliminate the conventional terminals which are projected in the radial direction so that it is possible to provide the miniaturized irreversible circuit element which can easily perform the wiring of center conductors.

Further, one-end sides of the electrodes are electrically led out to a lower side of the ferrite member by way of the second conductor which is formed of the conductive layer provided to a side face of the ferrite member and hence, it is possible to provide the miniaturized irreversible circuit element which can perform the wiring of the center conductors easily.

Further, dielectrics are formed of insulation films and hence, it is possible to provide the irreversible circuit element which can further reduce the thickness thereof.

Further, the ferrite member is constituted of the block body which is formed by laminating a plurality of ferrite thin plates and hence, it is possible to impart the degree of freedom to the shape of the ferrite member and, at the same time it is possible to manufacture the ferrite member easily.

Further, the irreversible circuit element includes the magnet which is arranged over the dielectrics, the first yoke which is arranged to cover the magnet, and the second yoke which is arranged below the ferrite member, wherein the magnetic closed loop is constituted by the first and the second yokes.

Accordingly, it is possible to perform the grounding of the lower electrode easily.

Further, the second yoke is arranged in the recess formed below the ferrite member, the second yoke is formed below the ferrite member, and the second yoke is electrically bonded to the lower electrode which becomes conductive with one end sides of the first, the second and the third center conductors. Accordingly, it is possible to obtain the thin irreversible circuit element and, at the same time, it is possible to perform the grounding of the lower electrode easily.

What is claimed is:

1. An irreversible circuit element comprising:

a planar ferrite member;

a plurality of dielectrics which are laminated to the ferrite member, the dielectrics being formed of an insulation material; and first, second and third center conductors which are formed on surfaces different in a vertical direction while sandwiching the dielectrics therebetween, the first, the second and the third center conductors having portions thereof to cross each other in the vertical direction.

2. An irreversible circuit element according to claim 1, wherein the first, the second and the third center conductors are formed on different surfaces of the dielectrics using conductive layers and, wherein at the same time, the dielectrics have connection portions which are made of conductive layers which are respectively connected to the first, the second and the third center conductors.

3. An irreversible circuit element according to claim 2, wherein a plurality of electrodes which face portions of the connection portions which are respectively connected to the first, the second and the third center conductors are provided to one of the dielectrics and the ferrite member, and wherein a capacitor is formed between one portion of one of the connection portions and the corresponding electrode.

4. An irreversible circuit element according to claim 3, wherein the plurality of electrodes formed of the conductive layers are formed on an upper surface of the ferrite member.

5. An irreversible circuit element according to claim 3, wherein a plurality of holes are formed in the dielectrics and the ferrite member, and wherein one-end sides of the first, the second and the third center conductors are electrically led but to a lower surface of the ferrite member in a state that one end sides of the first, the second and the third center conductors are connected to connection conductors formed inside the holes.

6. An irreversible circuit element according to claim 5, wherein the electrodes are connected to the connection conductors.

7. An irreversible circuit element according to claim 5, a lower electrode which is formed of a conductive layer is formed on a lower surface of the ferrite member and the connection conductors are connected to the lower electrode.

8. An irreversible circuit element according to claim 5, wherein the connection portions which are connected to other-end sides of the first, the second and the third center conductors are electrically led out to a lower side of the ferrite member by way of a first conductor made of a conductive layer formed on a side face of the ferrite member.

9. An irreversible circuit element according to claim 3, wherein one-end sides of the electrodes are electrically led out to a lower side of the ferrite member by way of a first conductor which is formed of a conductive layer provided to a side face of the ferrite member.

10. An irreversible circuit element according to claim 1, wherein the dielectrics are formed of insulation films.

11. An irreversible circuit element according to claim 1, wherein the ferrite member is constituted of a block body which is formed by laminating a plurality of ferrite thin plates.

12. An irreversible circuit element according to claim 1, wherein the irreversible circuit element includes a magnet which is arranged over the dielectrics, a first yoke which is arranged to cover the magnet, and a second yoke which is arranged below the ferrite member, and wherein a magnetic closed loop is constituted of the first and the second yokes.

13. An irreversible circuit element according to claim 12, wherein the second yoke is arranged in a recess formed below the ferrite member, wherein the second yoke is formed below the ferrite member, and wherein the second yoke is electrically bonded to a lower electrode which becomes conductive with one end sides of the first, the second and the third center conductors.

* * * * *